United States Patent
Tamaki

(10) Patent No.: US 7,468,540 B2
(45) Date of Patent: Dec. 23, 2008

(54) SEMICONDUCTOR DEVICE AND METHOD FOR MANUFACTURING THE SAME

(75) Inventor: Tokuhiko Tamaki, Osaka (JP)

(73) Assignee: Panasonic Corporation, Osaka (JP)

( * ) Notice: Subject to any disclaimer, the term of this patent is extended or adjusted under 35 U.S.C. 154(b) by 328 days.

(21) Appl. No.: 11/480,902

(22) Filed: Jul. 6, 2006

(65) Prior Publication Data
US 2007/0080373 A1 Apr. 12, 2007

(30) Foreign Application Priority Data
Oct. 6, 2005 (JP) ............................. 2005-293234

(51) Int. Cl.
*H01L 31/113* (2006.01)
*H01L 21/8234* (2006.01)

(52) U.S. Cl. ....................... 257/401; 438/275

(58) Field of Classification Search ................ 438/217, 438/229, 275–276; 257/341, 401, 391–392
See application file for complete search history.

(56) References Cited

U.S. PATENT DOCUMENTS

| | | | |
|---|---|---|---|
| 6,165,825 A * | 12/2000 | Odake | 438/217 |
| 6,287,912 B1 * | 9/2001 | Asakura et al. | 438/241 |
| 6,498,376 B1 * | 12/2002 | Miyagi et al. | 257/392 |

FOREIGN PATENT DOCUMENTS

| | | |
|---|---|---|
| JP | 06-204472 | 7/1994 |
| JP | 2002-118255 | 4/2002 |
| JP | 2004-039694 | 2/2004 |
| JP | 2004-533728 | 11/2004 |
| WO | WO 03/003442 A1 | 1/2003 |

* cited by examiner

*Primary Examiner*—Calvin Lee
(74) *Attorney, Agent, or Firm*—McDermot Will & Emery LLP

(57) ABSTRACT

In a semiconductor device including a core transistor and an I/O transistor on the same semiconductor substrate, the core transistor includes a gate insulating film, a gate electrode, sidewalls, extension diffusion layers, and source/drain diffusion layers. The I/O transistor includes a gate insulating film, a gate electrode, sidewalls, and source/drain diffusion layers. In the I/O transistor, the source/drain diffusion region is offset relative to a channel region located beneath the gate insulating film in regions below the sidewalls.

11 Claims, 5 Drawing Sheets

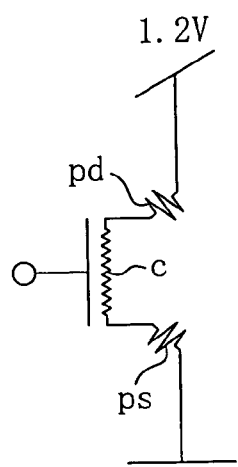
FIG. 2A
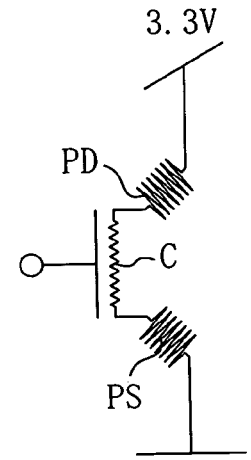
FIG. 2B
FIG. 3
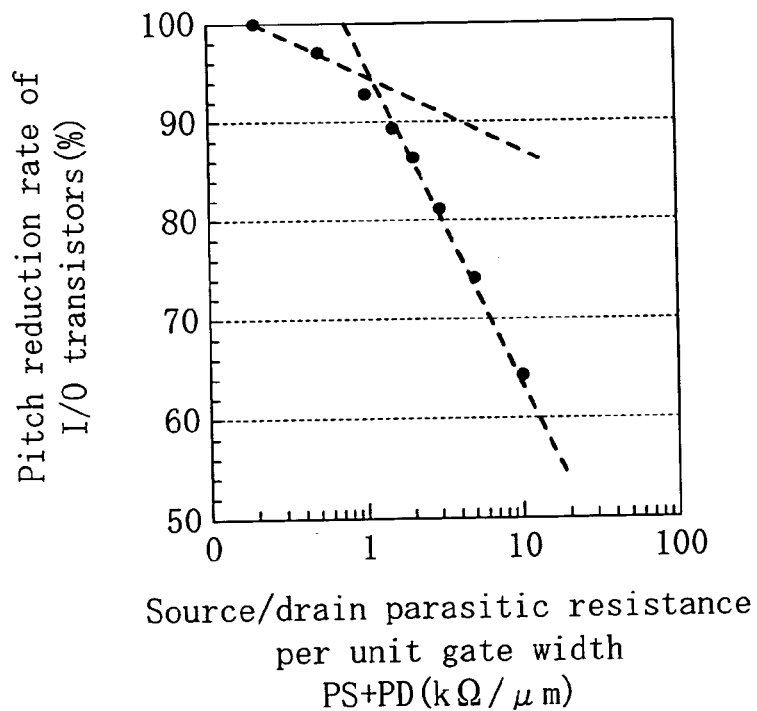

SEMICONDUCTOR DEVICE AND METHOD FOR MANUFACTURING THE SAME

CROSS REFERENCE TO RELATED APPLICATIONS

This Non-provisional application claims priority under 35 U.S.C. § 119(a) on Patent Application No. 2005-293234 filed in Oct. 6, 2005, the entire contents of which are hereby incorporated by reference.

BACKGROUND ART

The present invention relates to a semiconductor device and a method for manufacturing it, and specifically relates to a semiconductor device including MIS (Metal Insulator Semiconductor) transistors different in structure for coping with a plurality of source voltages and a method for manufacturing it.

As is known, the gate length of MIS transistors used in large scale integrated circuits has been reduced to less than 0.1 µm, and further development for miniaturization is being advanced. In general, a plurality of source voltages are supplied to a semiconductor chip, wherein the semiconductor chip is composed of a core transistor that is driven at a low source voltage for processing and an I/O transistor that is driven at a high source voltage for transmitting data to and from another chip or for dealing with analog data. The core transistor dominantly occupies the chip area, and the processing speed of the chip depends on the performance of the core transistor. Therefore, the size and the performance of the core transistor gather attention in many cases (as for the foregoing, see Japanese Patent Application Laid Open Publication Nos. 6-204472A, 2002-118255A, 2004-39694A, and 2004-533728A, for example).

The core transistor has been miniaturized progressively along the scaling law while miniaturization of only a contact diameter or a distance between a contact and a gate has been promoted in the I/O transistor. Under the circumstances, the dimensional difference between the core transistor and the I/O transistor grows wider and wider in recent years.

FIG. 6 shows the relationship between the semiconductor process generation (the axis of abscissas) and the circuit areas (arbitrary unit) of the core transistor and the I/O transistor (the axis of ordinates on the left) and the relationship between the semiconductor process generation (the axis of abscissas) and the circuit occupancy (%) of the I/O transistor (the axis of ordinates on the right).

As can be cleared from FIG. 6, the circuit area of the I/O transistor in a chip is no more than 10% in 0.18 µm generation. In association with remarkable reduction in circuit area of the core transistor, the circuit occupancy of the I/O transistor increases to 30% or more in some chips in 65 nm generation. If such rate reduction in circuit area of the core transistor occupying a chip would progress, there would be little or no difference in circuit area in a chip between the I/O transistor and the core transistor in 45 nm generation. This leads to slowing down of miniaturization of a chip as a whole, resulting in less scaling effect attained.

SUMMARY OF THE INVENTION

In view of the foregoing, the present invention is directed to a semiconductor device including on the same semiconductor substrate a first MIS transistor that is driven at a relatively low source voltage and a second MIS transistor that is driven at a relatively high source voltage. The present invention has its object of providing a semiconductor device in which excessive ON current is suppressed by remarkably reducing voltage to be applied to a channel region of the second MIS transistor with the gate length of the second MIS transistor reduced and providing a method for manufacturing it.

To attain the above object, a first aspect of the present invention provides a semiconductor device, including: a first MIS transistor which is driven at a relatively low source voltage; and a second MIS transistor which is driven at a relatively high source voltage, the first MIS transistor and the second MIS transistor being formed on the same semiconductor substrate, wherein the first MIS transistor includes: a first gate insulating film formed on the semiconductor substrate; a first gate electrode formed on the first gate insulating film; a first sidewall insulating film formed at each side face of the first gate electrode; and a first impurity diffusion region formed in a region of the semiconductor substrate which is located on each side of the first gate electrode, the second MIS transistor includes: a second gate insulating film formed on the semiconductor substrate; a second gate electrode formed on the second gate insulating film; a second sidewall insulating film formed at each side face of the second gate electrode; and a second impurity diffusion region formed in a region of the semiconductor substrate which is located on each side of the second gate electrode, and a first channel region is formed beneath the first gate insulting film so as not to be offset relative to the first impurity diffusion region while a second channel region is formed beneath the second gate insulating film so as to be offset relative to the second impurity diffusion region.

In the semiconductor device according to the first aspect of the present invention, which includes, on the same substrate, a first MIS transistor (a core transistor for processing, for example) that is driven at a relatively low source voltage and a second MIS transistor (an I/O transistor, for example) that is driven at a relatively high source voltage, the first impurity diffusion region is not offset relative to the first channel region located beneath the first gate insulating film while the second impurity diffusion region is offset relative to the second channel region located beneath the second gate insulating film. With this arrangement, the OFF state is maintained until a depletion layer generated below the second gate insulating film at turning ON extends to the second impurity diffusion region, and large parasitic resistance is caused between the source and the drain of the second MIS transistor. Accordingly, parasitic resistance caused between the source and the drain of the first MIS transistor that is driven at a relatively low source voltage is suppressed while large parasitic resistance therebetween of the second MIS transistor that is driven at a relatively high source voltage is caused intentionally to remarkably lower the voltage to be applied to the channel region of the second MIS transistor compared with the source voltage. As a result, the gate length can be reduced and excessive ON current can be suppressed, which would involve an adverse influence on the reliability of the second MIS transistor, leading to reduction in chip area. Further, the offset relationship between the second channel region located beneath the second gate insulating film and the second impurity diffusion region in the second MIS transistor suppresses off-leak current caused between the source and the drain of the second MIS transistor.

In the semiconductor device according to the first aspect of the present invention, it is preferable as a second type that the first impurity diffusion region and the second impurity diffusion region serve as source/drain diffusion regions and an extension diffusion region is formed below the first sidewall insulating film in the semiconductor substrate while no extension diffusion region is formed below the second sidewall insulating film in the semiconductor substrate.

The above arrangement in which no extension diffusion region is formed below the second sidewall insulating films realizes the offset relationship between the second channel region located beneath the second gate insulating film and the second impurity diffusion region.

In the semiconductor device according to the first aspect of the present invention, the second impurity diffusion region is offset relative to the second channel region in a transverse direction in a region below the second sidewall insulating film.

The second impurity diffusion regions can be offset relative to the second channel region in the transverse direction in a region below the second sidewall insulating films. In this case, the offset amount is equal to the width at the lower part of each second sidewall insulating film.

Particularly, in the above first type, it is preferable that the upper level of a region of the semiconductor substrate where it is located below the first sidewall insulating film is equal to the upper level of the first channel region and the upper level of a region of the semiconductor substrate where it is located below the second sidewall insulating film is lower than the upper level of the second channel region.

By the above arrangement, the second impurity diffusion regions are offset largely relative to the second channel region beneath the second gate insulating film in addition to by not forming the extension diffusion layer below the second sidewall insulating films. As a result the aforementioned effects are enhanced.

The offset amount in this case is a total amount of the width at the lower part of each second sidewall insulating film and the difference between the upper level of a part of the semiconductor substrate which is located on the side of the second gate electrode and the lower level of the second gate insulating film.

In the semiconductor device according to the first aspect of the present invention, it is preferable as a second type that the first impurity diffusion region and the second impurity diffusion region serve as extension diffusion regions, the upper level of the first impurity diffusion region is equal to the upper level of the first channel region, and the upper level of the second impurity diffusion region is lower than the upper level of the second channel region.

Since the upper level of the second impurity diffusion region is lower than the upper level of the second channel region, the second impurity diffusion region is offset relative to the second channel region beneath the second gate insulating film.

In the semiconductor device according to the first aspect of the present invention, the second impurity diffusion region is preferably offset relative to the second channel region in a vertical direction in a region below the second gate electrode.

The second impurity diffusion region can be offset relative to the second channel region in a region below the second gate electrode in the vertical direction. In this case, the second impurity diffusion region is offset relative to the second channel region by a difference between the upper level of a part of the semiconductor substrate which is located on each side of the second gate electrode and the lower level of the second gate insulating film.

In the semiconductor device according to the first aspect of the present invention, especially, in the first type or the second type, the second impurity diffusion region is preferably higher in concentration than the first impurity diffusion region.

With the above arrangement, the second impurity diffusion region has a gentle concentration gradient, thereby avoiding concentration of the electric field on the second impurity diffusion region. As a result, withstand voltage between the source and the drain of the second MIS transistor increases.

A second aspect of the present invention provides a semiconductor device, including: a first MIS transistor which is driven at a relatively low source voltage; and a second MIS transistor which is driven at a relatively high source voltage, the first MIS transistor and the second MIS transistor being formed on the same semiconductor substrate, wherein the first MIS transistor includes: a first gate insulating film formed on the semiconductor substrate; a first gate electrode formed on the first gate insulating film; a first sidewall insulating film formed at each side face of the first gate electrode; and a first impurity diffusion region formed in a region of the semiconductor substrate which is located on each side of the first gate electrode, the second MIS transistor includes: a second gate insulating film formed on the semiconductor substrate; a second gate electrode formed on the second gate insulating film; a second sidewall insulating film formed at each side face of the second gate electrode; and a second impurity diffusion region formed in a region of the semiconductor substrate which is located on each side of the second gate electrode, a parasitic resistance of the first impurity diffusion region is 0.5 kΩ or lower, and a parasitic resistance of the second impurity diffusion region is 2 kΩ or higher.

In the semiconductor device according to the second aspect of the present invention, which includes, on the same substrate, a first MIS transistor (a core transistor for processing, for example) that is driven at a relatively low source voltage and a second MIS transistor (an I/O transistor, for example) that is driven at a relatively high source voltage, the parasitic resistance caused in the first MIS transistor is suppressed to 0.5 kΩ or lower to ensure the processing speed, and a large parasitic resistance of 2 kΩ or larger is caused intentionally in the second MIS transistor to remarkably lower the voltage to be applied to the channel region thereof compared with the source voltage. As a result, the gate length can be reduced and excessive ON current is suppressed, which involves an adverse influence on the reliability of the second MIS transistor, thereby reducing the chip area.

A first aspect of the present invention provides a semiconductor device manufacturing method, including the steps of: (a) defining a semiconductor substrate as a first MIS transistor formation region where a MIS transistor that is driven at a relatively low source voltage is to be formed and a second MIS transistor formation region where a MIS transistor that is driven at a relatively high source voltage is to be formed; (b) forming a first gate electrode on the first MIS transistor formation region with a first insulating film interposed and a second gate electrode on the second MIS transistor formation region with a second insulating film interposed; (c) performing ion implantation using the first gate electrode as an mask to form a first extension diffusion region in a region of the first MIS transistor formation region which is located on each side of the first gate electrode; (d) forming, after the step (c), a first sidewall insulating film at each side face of the first gate electrode and a second sidewall insulating film at each side face of the second gate electrode; and (e) forming a first source/drain diffusion region so as to be adjacent to the first extension diffusion region in a region of the first MIS transistor formation region which is located outwards from the first sidewall insulating film and forming a second source/drain diffusion region in a region of the second MIS transistor formation region which is located outwards from the second sidewall insulating film, wherein the first source/drain diffusion region is not offset relative to a first channel region located beneath the first gate insulating film in the first MIS transistor while the second source/drain diffusion region is offset relative to a second channel region located beneath the second gate insulating film in the second MIS transistor.

By the semiconductor device manufacturing method according to the first aspect of the present invention, the second MIS transistor has an offset structure in which the second extension diffusion region does not overlap the second channel region beneath the second gate insulating film. This attains the effect that the semiconductor device according to the first aspect of the present invention attains.

In the semiconductor device manufacturing method according to the first aspect of the present invention, the second sidewall insulating film is formed preferably in the step (d) after the second gate electrode is formed in the step (b) without performing a step of forming an extension diffusion region in a region in the second MIS transistor formation region which is located on each side of the second gate electrode.

With the above arrangement, the extension diffusion region is not formed in a region of the second MIS transistor formation region which is located on each side of the second gate electrode, attaining a structure in which the second source/drain diffusion region is offset relative to the second channel region.

Preferably, the semiconductor device manufacturing method according to the first aspect of the present invention further includes the step of (f) burrowing, after the step (b) and before the step (d), a region of the second MIS transistor formation region which is located on each side of the second gate electrode.

This attains an offset structure in the vertical direction in which the second source/drain diffusion region does not overlap the second channel region.

Preferably, the semiconductor device manufacturing method according to the first aspect of the present invention further includes the steps of: (f) burrowing, after the step (b) and before the step (d), a region of the second MIS transistor formation region which is located on each side of the second gate electrode; and (g) performing, after the step (f) and before the step (d), ion implantation using the second gate electrode as an mask to form a second extension diffusion region in a region of the second MIS transistor formation region which is located on each side of the second gate electrode.

Even with the second extension diffusion regions formed, a vertical offset structure in which the second extension diffusion region does not overlap the second channel region can be attained by the above arrangement.

A second aspect of the present invention provides a semiconductor device manufacturing method, including the steps of: (a) defining a semiconductor substrate as a first MIS transistor formation region where a MIS transistor that is driven at a relatively low source voltage is to be formed and a second MIS transistor formation region where a MIS transistor that is driven at a relatively high source voltage is to be formed; (b) forming a first gate electrode on the first MIS transistor formation region with a first insulating film interposed and a second gate electrode on the second MIS transistor formation region with a second insulating film interposed; (c) performing ion implantation using the first gate electrode as an mask to form a first extension diffusion region in a region of the first MIS transistor formation region which is located on each side of the first gate electrode; (d) performing ion implantation using the second gate electrode as an mask to form a second extension diffusion region in a region of the second MIS transistor formation region which is located on each side of the second gate electrode; (e) forming, after the step (c) and the step (d), a first sidewall insulating film at each side face of the first gate electrode and a second sidewall insulating film at each side face of the second gate electrode; and (f) forming a first source/drain diffusion region so as to be adjacent to the first extension diffusion region in a region of the first MIS transistor formation region which is located outwards from the first sidewall insulating film and forming a second source/drain diffusion region so as to be adjacent to the second extension diffusion region in a region of the second MIS transistor formation region which is located outwards from the second sidewall insulating film, wherein the step (c) is performed so that a parasitic resistance caused in the first source/drain diffusion region is 0.5 k$\Omega$ or lower, and the step (d) is performed so that a parasitic resistance caused in the second source/drain diffusion region is 2 k$\Omega$ or higher.

The semiconductor device manufacturing method according to the second aspect of the present invention can attain the aforementioned effects that the semiconductor device according to the second aspect of the present invention attains.

As described above, in the semiconductor device and the method for manufacturing it according to one aspect of the present invention, the source/drain structures are formed individually in the first MIS transistor (a core transistor, for example) and the second MIS transistor (an I/O transistor, for example) to remarkably lower only the voltage to be applied to the channel region of the second MIS transistor, suppressing excessive ON current which would involve an adverse influence on the reliability of the second MIS transistor. Further, the gate length of the second MIS transistor can be reduced, minimizing the chip area.

BRIEF DESCRIPTION OF THE DRAWINGS

FIG. 2A and FIG. 2B are schematic illustrations showing the relationships between channel resistance and source/drain parasitic resistance of transistors formed in a core transistor formation region and an I/O transistor formation region, respectively, according to Embodiment 1 of the present invention.

FIG. 3 is a graph showing the relationship between parasitic resistance and a pitch reduction rate of the transistors formed in the I/O transistor formation region according to Embodiment 1 of the present invention.

DESCRIPTION OF THE PREFERRED EMBODIMENTS

Figure 1A:
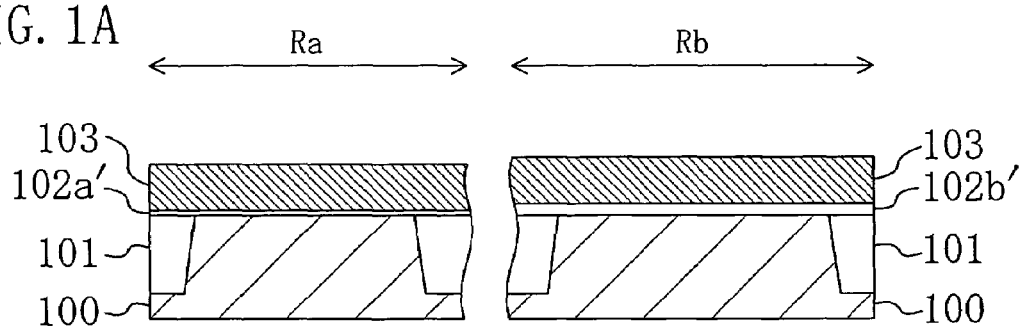
FIG. 1A to FIG. 1D are sections showing steps of a semiconductor device manufacturing method in a step sequence according to Embodiment 1 of the present invention.

Each embodiment of the present invention will be described below with reference to the accompanying drawings.

Embodiment 1

A semiconductor device manufacturing method according to Embodiment 1 of the present invention will be described below.

FIG. 1A to FIG. 1D are sections showing steps of the semiconductor device manufacturing method in a step sequence according to Embodiment 1 of the present invention. Wherein, in FIG. 1A to FIG. 1D, each region on the left side in the drawings indicates a core transistor formation region Ra where a core transistor is to be formed, and each region on the right side in the drawings indicates an I/O transistor formation region Rb where an I/O transistor is to be formed.

First, as shown in FIG. 1A, after an element isolation 101 made of an oxide film is formed in a semiconductor substrate 100 by an ordinary element isolation formation method, a silicon oxinitride film 102a' having a film thickness of, for example, 2 nm is formed on the semiconductor substrate 100 in the core transistor region Ra. As well, a silicon oxinitride film 102b' having a film thickness of, for example, 8 nm is formed thereon in the I/O transistor formation region Rb. Then, a polysilicon film 103 is formed on the silicon oxinitride film 102a' and the silicon oxinitride film 102b'.

Figure 1B:
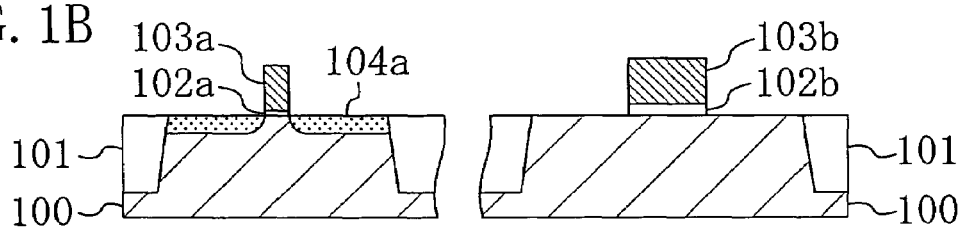

Subsequently, as shown in FIG. 1B, patterning by photolithography and dry etching is performed to form a gate insulating film 102a formed of the silicon oxinitride film 102a' and a gate electrode 103a formed of the polysilicon film 103 in the core transistor formation region Ra and to form a gate insulating film 102b formed of the silicon oxinitride film 102b' and a gate electrode 103b formed of the polysilicon film 103 in the I/O transistor region Rb. Wherein, the gate lengths of the gate electrodes 103a and 103b are 45 nm and 120 nm, respectively. Then, in the core transistor formation region Ra, an impurity is implanted into the semiconductor substrate 100 with the use of the gate electrode 103a as an implantation mask to form an extension diffusion layer 104a in a region on each side of the gate electrode 103a and the gate insulating film 102a. As to the implantation conditions, $As^+$ is implanted at an implantation energy of 4 KeV and at a dose of $1 \times 10^{15}$ atom/cm$^2$ for forming an n-channel type MIS transistor in the core transistor formation region Ra or $B^+$ is implanted at an implantation energy of 0.6 KeV and at a dose of $2.5 \times 10^{14}$ atom/cm$^2$ for forming a p-channel type MIS transistor in the core transistor formation region Ra. No extension diffusion layer is formed in the I/O transistor formation region Rb.

Figure 1C:
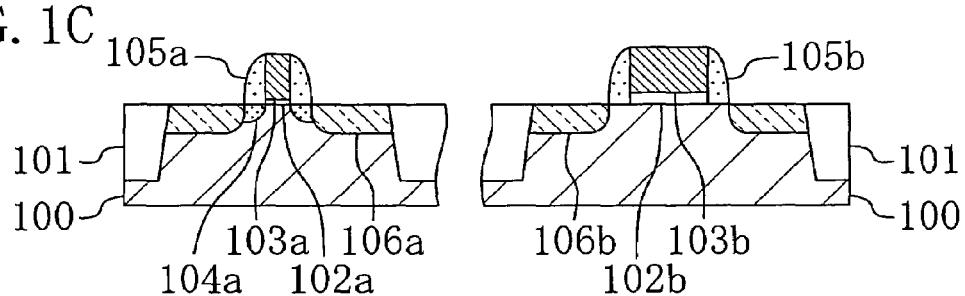

Next, as shown in FIG. 1C, a silicon oxide film, for example, is deposited on the entirety of the semiconductor substrate 100, and sidewalls 105a and 105b having a width of 30 nm are formed by dry etching at the side faces of the gate insulating film 102a and the gate electrode 103a and at the side faces of the gate insulating film 102b and the gate electrode 103b, respectively. Then, an impurity of $As^+$ (for forming the n-channel type MIS transistor) or $B^+$ (for forming the p-channel type MIS transistor) is implanted selectively into the semiconductor substrate 100 in the core transistor formation region Ra with the use of the gate electrode 103a and the sidewalls 105a as an implantation mask. Thermal treatment is performed for activating the impurity to form source/drain diffusion layers 106a. On the other hand, in the I/O transistor formation region Rb, an impurity of $As^+$ (for forming the n-channel type MIS transistor) or $B^+$ (for forming the p-channel type MIS transistor) is implanted selectively into the semiconductor substrate 100 with the use of the gate electrode 103b and the sidewalls 105b as an implantation mask. Thermal treatment is performed for activating the impurity to form source/drain diffusion layers 106b.

Figure 1D:
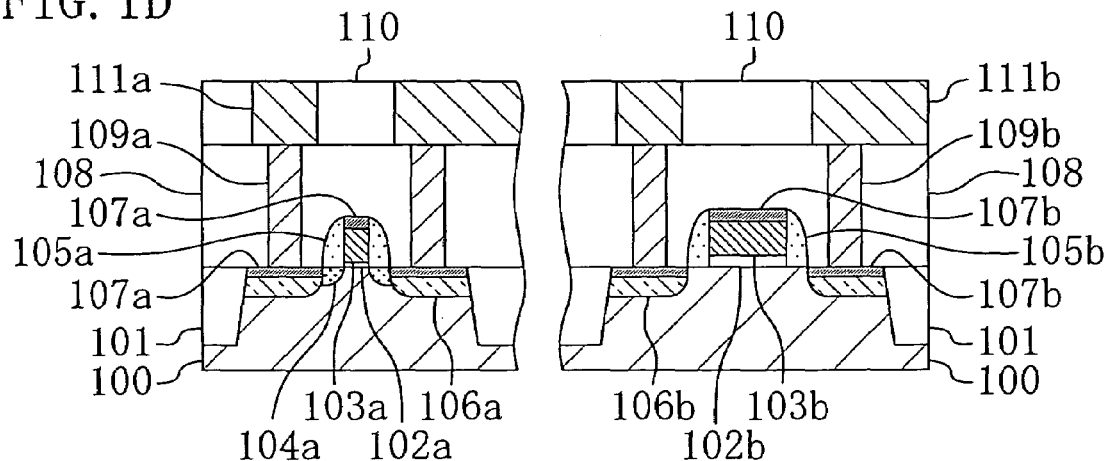

Thereafter, as shown in FIG. 1D, in the core transistor formation region Ra and the I/O transistor formation region Rb, a nickel silicide layers 107a and 107b are formed on the gate electrodes 103a and 103b and the source/drain diffusion layers 106a and 106b, respectively, by a known method. Then, in the core transistor formation region Ra and the I/O transistor formation region Rb, a first interlayer insulating film 108 made of a silicon oxide film is formed so as to cover the entirety of the semiconductor substrate 100, and plugs 109a and 109b made of tungsten are formed so as to pass through the first interlayer insulating film 108 and so as to reach at the lower ends thereof the nickel silicide layers 107a and 107b, respectively. After a second interlayer insulating film 110 made of a silicon oxide film is formed on the first interlayer insulating film 108 and the plugs 109a, 109b, wirings 111a and 111b made of copper are formed in the second interlayer insulating film 110 so as to be connected to the plugs 109a and 109b, respectively. Thus, the core transistor and the I/O transistor are formed.

FIG. 2A is a schematic illustration showing channel resistance and source/drain parasitic resistance in a core transistor formed in the core transistor formation region Ra, and FIG. 2B is a schematic illustration showing channel resistance and source/drain parasitic resistance in an I/O transistor formed in the I/O transistor formation region Rb.

Regions to be the respective channel regions of the transistors are located beneath the gate insulating films 102 and 102b, as shown in, for example, FIG. 1D. Accordingly, the source/drain parasitic resistance is caused in regions where the extension diffusion layers 104a are formed in the core transistor formation region Ra and regions below the sidewalls 105b in the I/O transistor formation region Rb.

Referring to the core transistor formation region Ra, as shown in FIG. 2A, the source/drain parasitic resistance ps+pd caused in a transistor formed by the manufacturing method in the present embodiment is approximately 0.2 kΩ/μm per unit gate width. This value of the parasitic resistance is sufficiently small relative to the channel resistance c in the ON state, approximately 3 kΩ/μm, which proves that the processing speed of the transistor formed in the core transistor formation region Ra is ensured.

Referring in contrast to the I/O transistor formation region Rb, as shown in FIG. 2B, the source/drain parasitic resistance PS+PD caused in a transistor formed by the manufacturing method in the present embodiment is large, approximately 8 kΩ/μm per unit gate width. This is because: with no extension diffusion layer formed in the I/O transistor formation region Rb, the channel region located beneath the gate insulating film 102b is distant from the source/drain diffusion layers 106b (an offset source/drain structure), and this makes the transistor to remain in the OFF state until a depletion layer generated below the gate insulating film 102b at turning ON extends to the source/drain diffusion layers 106b and makes regions below the sidewalls 105b to serve as large parasitic resistors in the ON state.

FIG. 3 shows the relationship between the parasitic resistance PS+PD per unit gate width and a pitch reduction rate of the I/O transistors formed in the I/O transistor formation region Rb in the case where the gate length is reduced until ON current becomes equal to a value where no parasitic resistance is caused, wherein the source voltage for the I/O transistors formed in the I/O transistor formation region Rb is set to 3.3 V.

As can be cleared from FIG. 3, insertion of 1 kΩ/μm or larger source/drain parasitic resistance PS+PD per unit gate width can lead to reduction in pitch of the I/O transistors formed in the I/O transistor formation region Rb.

In the present embodiment, the source/drain parasitic resistance PS+PD is set to 8 kΩ/μm per unit gate width. This confirms that the gate length can be reduced from 350 mn, which is an ordinary gate length, to 120 nm, with a result of 35% reduction in circuit area of the I/O transistor in a chip. As described above, with the offset source/drain structure, off-leak current can be suppressed between the source and the drain of the transistor formed in the I/O transistor formation region Rb.

Embodiment 2

A semiconductor device manufacturing method according to Embodiment 2 of the present invention will be described below.

FIG. 4A to FIG. 4D are sections showing steps of the semiconductor device manufacturing method in a step sequence according to Embodiment 2 of the present invention. Wherein, in FIG. 4A to FIG. 4D, each region on the left side in the drawings indicates a core transistor formation region Ra where a core transistor is to be formed, and each region on the right side in the drawings indicates an I/O transistor formation region Rb where an I/O transistor is to be formed.

Figure 4A:
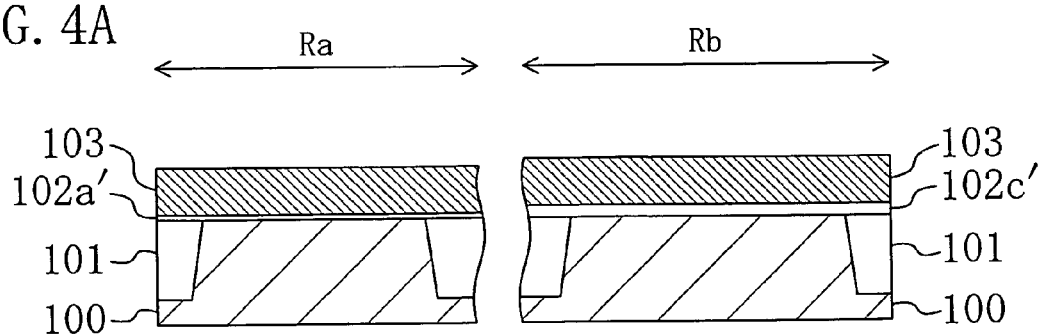
FIG. 4A to FIG. 4D are sections showing steps of a semiconductor device manufacturing method in a step sequence according to Embodiment 2 of the present invention.

First, as shown in FIG. 4A, after an element isolation 101 made of an oxide film is formed in a semiconductor substrate 100 by an ordinary element isolation formation method, a silicon oxinitride film 102a' having a film thickness of, for example, 2 nm is formed on the semiconductor substrate 100 in the core transistor region Ra. As well, a silicon oxinitride film 102c' having a film thickness of, for example, 8 nm is formed thereon in the I/O transistor formation region Rb. Then, a polysilicon film 103 is formed on the silicon oxinitride film 102a' and the silicon oxinitride film 102c'.

Figure 4B:
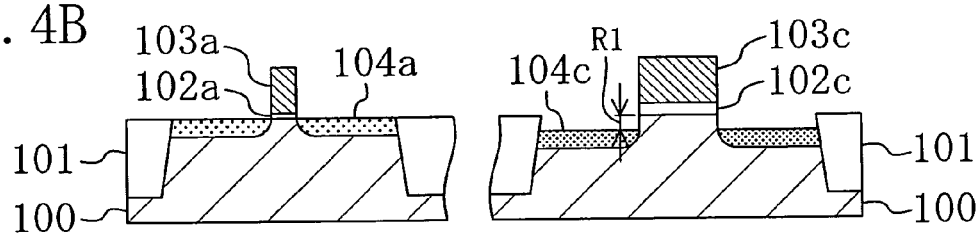

Subsequently, as shown in FIG. 4B, patterning by photolithography and dry etching is performed to form a gate insulating film 102a formed of the silicon oxinitride film 102a' and a gate electrode 103a formed of the polysilicon film 103 in the core transistor formation region Ra and to form a gate insulating film 102c formed of the silicon oxinitride film 102c' and a gate electrode 103c formed of the polysilicon film 103 in the I/O transistor region Rb. Wherein, the gate lengths of the gate electrodes 103a and 103c are 45 nm and 120 nm, respectively. Then, in the I/O transistor formation region Rb, the semiconductor substrate 100 is burrowed by 40 nm by dray etching to form recesses R1. An impurity is implanted into the semiconductor substrate 100 with the use of the gate electrode 103a as an implantation mask in the core transistor formation region Ra to form an extension diffusion layer 104a in a region on each side of the gate electrode 103a and the gate insulting film 102a. As well, in the I/O transistor formation region Rb, an impurity is implanted into the semiconductor substrate 100 with the use of the gate electrode 103c and the gate insulating film 102c as an implantation mask to form an extension diffusion layer 104c in a region on each side of the gate electrode 103c.

The ion implantation conditions are not limited specifically. The ion implantation may be performed so as to or so as not to make difference in concentration between the extension diffusion layers 104a in the core transistor formation region Ra and the extension diffusion layers 104c in the I/O transistor formation region Rb. When the extension diffusion layers 104c are set lower in concentration than the extension diffusion layers 104a, the extension diffusion layers 104c have a gentle concentration gradient. This prevents concentration of the electric field, resulting in an increase in withstand voltage between the source and the drain of the I/O transistor formed in the I/O transistor formation region Rb. In contrast, in the case where the concentration of the extension diffusion layers 104a is set substantially equal to that of the extension diffusion layers 104c, the extension diffusion layers 104a and 104b can be formed simultaneously by the same process.

Referring to the implantation conditions, examples are as follows. $As^+$ is implanted at an implantation energy of 4 KeV and at a dose of $1\times10^{15}$ atom/cm$^2$ for forming an n-channel type MIS transistor in the core transistor formation region Ra or $B^+$ is implanted at an implantation energy of 0.6 KeV and at a dose of $2.5\times10^{14}$ atom/cm$^2$ for forming a p-channel type MIS transistor in the core transistor formation region Ra. Further, $As^+$ is implanted at an implantation energy of 5 KeV and at a dose of $1\times10^{15}$ atom/cm$^2$ for forming an n-channel type MIS transistor in the I/O transistor formation region Rb or $B^+$ is implanted at an implantation energy of 0.8 KeV and at a dose of $3.5\times10^{14}$ atom/cm$^2$ for forming a p-channel type MIS transistor in the I/O transistor formation region Ra.

Figure 4C:
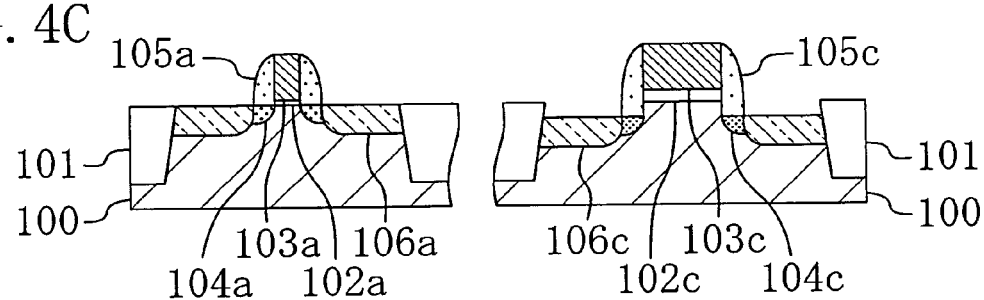

Next, as shown in FIG. 4C, a silicon oxide film, for example, is deposited on the entirety of the semiconductor substrate 100, and sidewalls 105a and 105c having a width of 30 nm are formed by dry etching at the side faces of the gate insulating film 102a and the gate electrode 103a and at the side faces of the gate insulating film 102c and the gate electrode 103c, respectively. Then, an impurity of $As^+$ (for forming the n-channel type MIS transistor) or $B^+$ (for forming the p-channel type MIS transistor) is implanted selectively into the semiconductor substrate 100 in the core transistor formation region Ra with the use of the gate electrode 103a and the sidewalls 105a as an implantation mask. Thermal treatment is performed for activating the impurity to form source/drain diffusion layers 106a. On the other hand, in the I/O transistor formation region Rb, an impurity of $As^+$ (for forming the n-channel type MIS transistor) or $B^+$ (for forming the p-channel type MIS transistor) is implanted selectively into the semiconductor substrate 100 with the use of the gate electrode 103c and the sidewalls 105c as an implantation mask. Thermal treatment is performed for activating the impurity to form source/drain diffusion layers 106c.

Figure 4D:
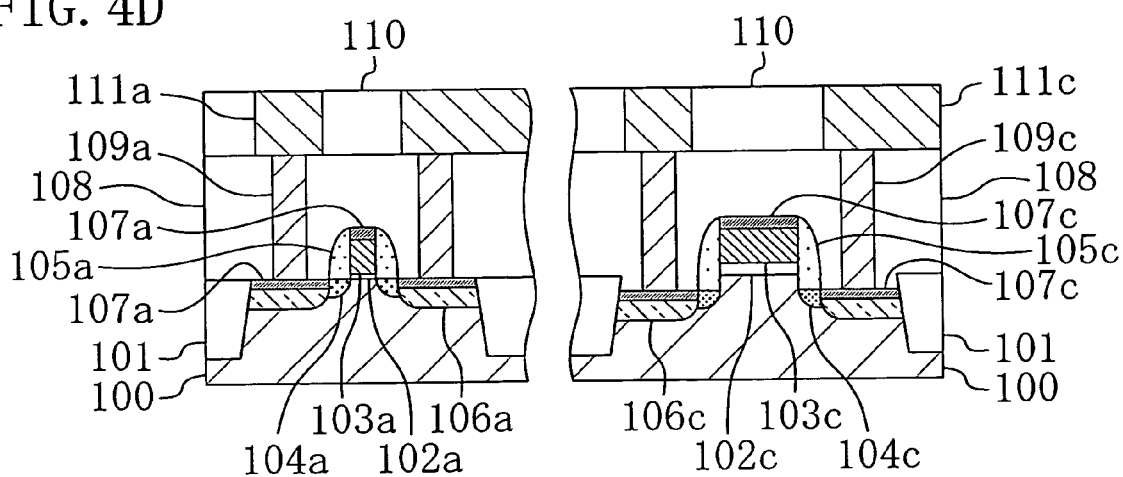

Thereafter, as shown in FIG. 4D, in the core transistor formation region Ra and the I/O transistor formation region Rb, nickel silicide layers 107a and 107c are formed on the gate electrodes 103a and 103c and the source/drain diffusion layers 106a and 106c, respectively, by a known method. Then, in the core transistor formation region Ra and the I/O transistor formation region Rb, a first interlayer insulating film 108 made of a silicon oxide film is formed so as to cover the entirety of the semiconductor substrate 100, and plugs 109a and 109c made of tungsten are formed so as to pass through the first interlayer insulating film 108 and so as to reach at the lower ends thereof the nickel silicide layers 107a and 107c, respectively. After a second interlayer insulating film 110 made of a silicon oxide film is formed on the first interlayer insulating film 108 and the plugs 109a, 109c, wirings 111a and 111c made of copper are formed in the second interlayer insulating film 110 so as to be connected to the plugs 109a and 109c, respectively. Thus, the core transistor and the I/O transistor are formed.

Similarly to that in Embodiment 1, the channel resistance c and the source/drain parasitic resistance ps+pd of a core transistor formed in the core transistor formation region Ra are illustrated schematically in FIG. 2A while the channel resistance C and the source/drain parasitic resistance PS+PD of an I/O transistor formed in the I/O transistor formation region Rb are illustrated schematically in FIG. 2B, as well. Regions to be the respective channel regions of the transistors are located beneath the gate insulating films 102a and 102c shown in, for example, FIG. 4D, and the source/drain parasitic resistance is caused in the extension diffusion layers 104a in the core transistor formation region Ra and in regions of the semiconductor substrate 100 at the side faces of the sidewalls 105c in the I/O transistor formation region Rb (a region between the extension diffusion layers 104c and the lower face of the gate insulating film 102c).

In the core transistor formation region Ra, the source/drain parasitic resistance ps+pd caused in a transistor formed by the manufacturing method in the present embodiment is approximately 0.2 kΩ/μm per unit gate width. This value of the parasitic resistance is sufficiently small relative to the channel resistance c in the ON state, approximately 3 kΩ/μm, which proves that the processing speed of the transistor formed in the core transistor formation region Ra is ensured.

In contrast, in the I/O transistor formation region Rb, the source/drain parasitic resistance PS+PD caused in a transistor formed by the manufacturing method in the present embodiment is large, approximately 8 kΩ/μm per unit gate width. This is because: with the recesses R1 formed in the I/O transistor formation region Rb, the channel region located beneath the gate insulating film 102b is distant from the extension diffusion layers 104c, and this makes the transistor to remain in the OFF state until a depletion layer generated below the gate insulating film 102c at turning ON extends to the source/drain diffusion layers 106c and makes the extension diffusion layers 104 to serve as large parasitic resistors in the ON state.

The source/drain parasitic resistance PS+PD is 8 kΩ/μm per unit gate width in the present embodiment. This confirms that the gate length can be reduced from 350 nm, which is an ordinarily gate length, to 120 nm, with a result of 35% reduction in circuit area of the I/O transistor in a chip, as can be cleared from FIG. 3. As described above, the channel region beneath the gate insulating film 102c is distant from the extension diffusion layers 104c, so that off-leak current can be suppressed between the source and the drain of the I/O transistor formed in the I/O transistor formation region Rb.

The present embodiment describes the case where the extension diffusion layers 104c are formed in the I/O transistor formation region Rb in the present embodiment. However, when the extension diffusion layer 104c is not formed as in the Embodiment 1 after the formation of the recesses R1 in the I/O transistor formation region Rb, a further effective result could be obtained.

Embodiment 3

A semiconductor device manufacturing method according to Embodiment 3 of the present invention will be described below.

FIG. 5A to FIG. 5D are sections showing steps of the semiconductor device manufacturing method in a step sequence according to Embodiment 3 of the present invention. Wherein, in FIG. 5A to FIG. 5D, each region on the left side in the drawings indicates a core transistor formation region Ra where a core transistor is to be formed, and each region on the right side in the drawings indicates an I/O transistor formation region Rb where an I/O transistor is to be formed.

Figure 5A:
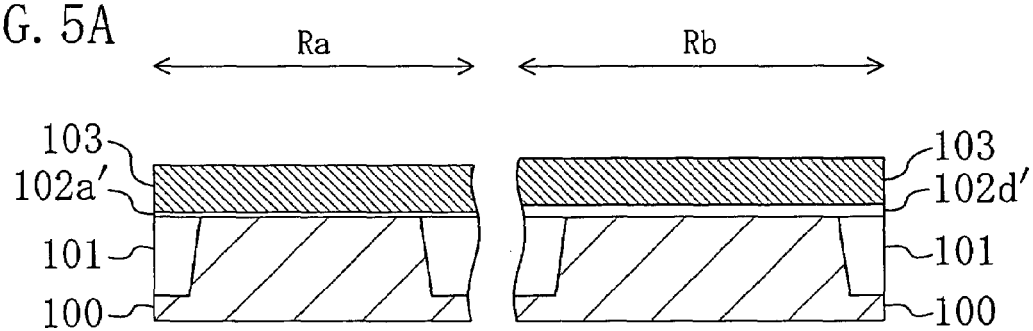
FIG. 5A to FIG. 5D are sections showing steps of a semiconductor device manufacturing method in a step sequence according to Embodiment 3 of the present invention.

First, as shown in FIG. 5A, after an element isolation 101 made of an oxide film is formed in a semiconductor substrate 100 by an ordinary element isolation formation method, a silicon oxinitride film 102a' having a film thickness of, for example, 2 nm is formed on the semiconductor substrate 100 in the core transistor region Ra. As well, a silicon oxinitride film 102d' having a film thickness of, for example, 8 nm is formed thereon in the I/O transistor formation region Rb. Then, a polysilicon film 103 is formed on the silicon oxinitride film 102a' and the silicon oxinitride film 102d'.

Figure 5B:
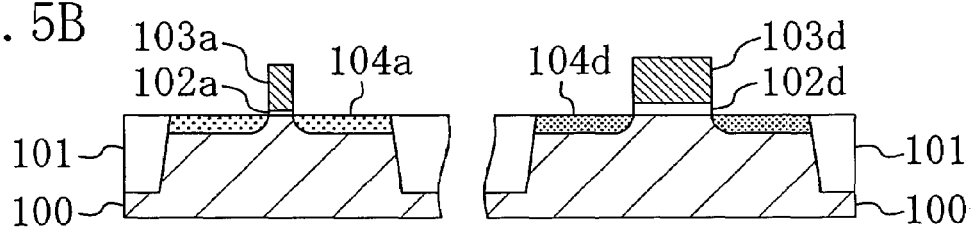

Subsequently, as shown in FIG. 5B, patterning by photolithography and dry etching is performed to form a gate insulating film 102a formed of the silicon oxinitride film 102a' and a gate electrode 103a formed of the polysilicon film 103 in the core transistor formation region Ra and to form a gate insulating film 102d formed of the silicon oxinitride film 102d' and a gate electrode 103d formed of the polysilicon film 103 in the I/O transistor region Rb. Wherein, the gate lengths of the gate electrodes 103a and 103c are 45 nm and 180 nm, respectively.

Next, an impurity is implanted into the semiconductor substrate 100 with the use of the gate electrode 103a as an implantation mask in the core transistor formation region Ra to form an extension diffusion layer 104a having a sheet resistance of 3 kΩ/□ or lower in a region on each side of the gate electrode 103a and the gate insulating film 102a. As well, in the I/O transistor formation region Rb, an impurity is implanted into the semiconductor substrate 100 with the use of the gate electrode 103d as an implantation mask to form an extension diffusion layer 104d having a sheet resistance of 12 kΩ/□ or higher in a region on each side of the gate electrode 103d and the gate insulating film 102d.

Referring to the implantation conditions, As$^+$ is implanted at an implantation energy of 4 KeV and at a dose of $1 \times 10^{15}$ atom/cm$^2$ for forming an n-channel type MIS transistor in the core transistor formation region Ra or B$^+$ is implanted at an implantation energy of 0.6 KeV and at a dose of $2.5 \times 10^{14}$ atom/cm$^2$ for forming a p-channel type MIS transistor in the core transistor formation region Ra. Further, As$^+$ is implanted at an implantation energy of 5 KeV and at a dose of $1 \times 10^{14}$ atom/cm$^2$ for forming an n-channel type MIS transistor in the I/O transistor formation region Rb or B$^+$ is implanted at an implantation energy of 0.8 KeV and at a dose of $3 \times 10^{13}$ atom/cm$^2$ for forming a p-channel type MIS transistor in the I/O transistor formation region Rb.

Figure 5C:
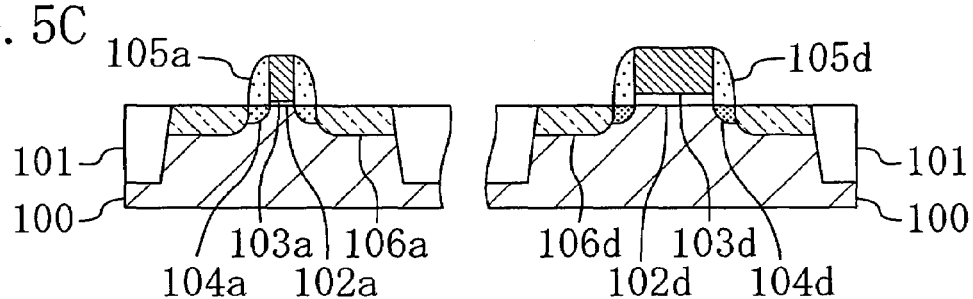

Next, as shown in FIG. 5C, a silicon oxide film, for example, is deposited on the entirety of the semiconductor substrate 100, and sidewalls 105a and 105d having a width of 30 nm are formed by dry etching at the side faces of the gate insulating film 102a and the gate electrode 103a and at the side faces of the gate insulating film 102d and the gate electrode 103d, respectively. Then, an impurity of As$^+$ (for forming the n-channel type MIS transistor) or B$^+$ (for forming the p-channel type MIS transistor) is implanted selectively into the semiconductor substrate 100 in the core transistor formation region Ra with the use of the gate electrode 103a and the sidewalls 105a as an implantation mask. Thermal treatment is performed for activating the impurity to form source/drain diffusion layers 106a. On the other hand, in the I/O transistor formation region Rb, an impurity of As$^+$ (for forming the n-channel type MIS transistor) or B$^+$ (for forming the p-channel type MIS transistor) is implanted selectively into the semiconductor substrate 100 with the use of the gate electrode 103d and the sidewalls 105d as an implantation mask. Thermal treatment is performed for activating the impurity to form source/drain diffusion layers 106d.

Figure 5D:
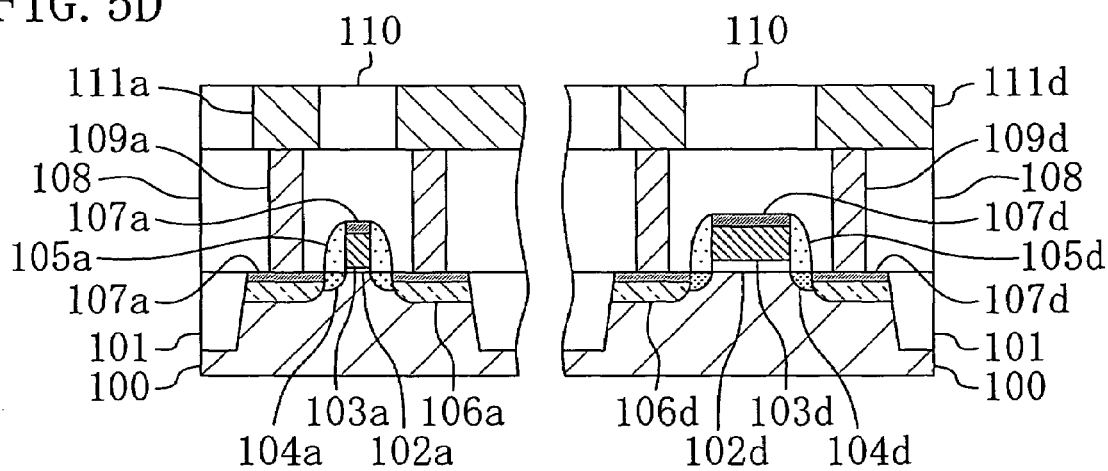
Figure 6:
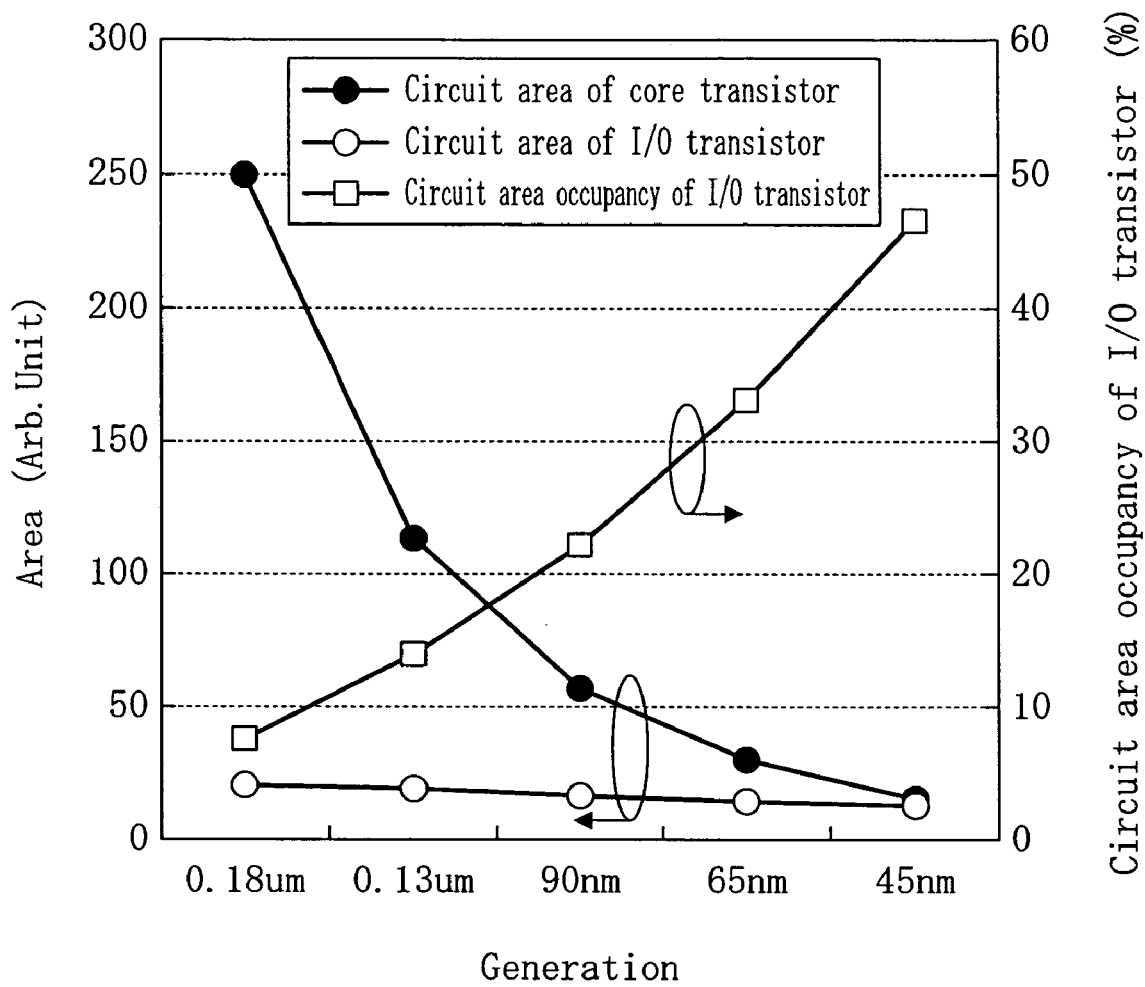
FIG. 6 is a graph showing the relationship of each circuit area of a core transistor and an I/O transistor in a chip or occupancy of the circuit area of the I/O transistor in a chip with respect to the transition of semiconductor process generation.

Thereafter, as shown in FIG. 5D, in the core transistor formation region Ra and the I/O transistor formation region Rb, nickel silicide layers 107a and 107d are formed on the gate electrodes 103a and 103d and the source/drain diffusion layers 106a and 106d, respectively, by a known method. Then, in the core transistor formation region Ra and the I/O transistor formation region Rb, a first interlayer insulating film 108 made of a silicon oxide film is formed so as to cover the entirety of the semiconductor substrate 100, and plugs 109a and 109d made of tungsten are formed so as to pass through the first interlayer insulating film 108 and so as to reach at the lower ends thereof the nickel silicide layers 107a and 107d, respectively. After a second interlayer insulating film 110 made of a silicon oxide film is formed on the first interlayer insulating film 108 and the plugs 109a, 109d, wirings 111a and 111c made of copper are formed in the second interlayer insulating film 110 so as to be connected to the plugs 109a and 109d, respectively. Thus, the core transistor and the I/O transistor are formed.

Similarly to that in Embodiment 1, the channel resistance c and the source/drain parasitic resistance ps+pd of a core transistor formed in the core transistor formation region Ra are illustrated schematically in FIG. 2A while the channel resistance C and the source/drain parasitic resistance PS+PD of an I/O transistor formed in the I/O transistor formation region Rb are illustrated schematically in FIG. 2B, as well. Regions to be the channel regions of the core transistor and the I/O transistor are located beneath the gate insulating films 102a and 102d shown in, for example, FIG. 5D, respectively, and the source/drain parasitic resistance is caused in the extension diffusion layers 104a and 104d.

In the core transistor formation region Ra, the source/drain parasitic resistance ps+pd caused in a transistor formed by the manufacturing method in the present embodiment is approximately 0.2 kΩ/μm per unit gate width. This value of the parasitic resistance is sufficiently small relative to the channel resistance c in the ON state, approximately 3 kΩ/μm, which proves that the processing speed of the transistor formed in the core transistor formation region Ra is ensured.

In contrast, in the I/O transistor formation region Rb, the source/drain parasitic resistance PS+PD caused in a transistor formed by the manufacturing method in the present embodiment is approximately 5 kΩ/μm per unit gate width, which is almost equal to the channel resistance C in the ON state, approximately 6 kΩ/μm. The voltage applied to the channel region is almost a half of the source voltage in the ON state. Accordingly, excessive ON current, which would involve an adverse influence on the reliability of the I/O transistor, can be suppressed with the gate length of the I/O transistor reduced in the I/O transistor formation region Rb.

In the present embodiment, the source/drain parasitic resistance PS+PD is 5 kΩ/μm per unit gate width. This confirms that the gate length can be reduced from 350 nm, which is an ordinarily gate length, to 180 nm, with a result of 25% reduction in circuit area of the I/O transistor in a chip, as can be cleared from FIG. 3.

In each embodiment, the sidewalls (105a to 105d) are formed as sidewall insulating films formed at the side faces of each gate electrode (102a to 102d), but the present invention is not limited thereto and is applicable to a structure in which offset spacers in an I shape in section and/or insulting films in an L shape in section are interposed between the sidewalls and each gate electrode.

The present invention is useful for semiconductor devices including a core transistor and an I/O transistor on the same substrate and methods for manufacturing them.

What is claimed is:

1. A semiconductor device, comprising:
   a first MIS transistor which is driven at a relatively low source voltage; and
   a second MIS transistor which is driven at a relatively high source voltage, the first MIS transistor and the second MIS transistor being formed on the same semiconductor substrate,
   wherein the first MIS transistor includes:
      a first gate insulating film formed on the semiconductor substrate;
      a first gate electrode formed on the first gate insulating film;
      a first sidewall insulating film formed at each side face of the first gate electrode; and
      a first impurity diffusion region formed in a region of the semiconductor substrate which is located on each side of the first gate electrode,
   the second MIS transistor includes:
      a second gate insulating film formed on the semiconductor substrate;
      a second gate electrode formed on the second gate insulating film;
      a second sidewall insulating film formed at each side face of the second gate electrode; and
      a second impurity diffusion region formed in a region of the semiconductor substrate which is located on each side of the second gate electrode, and
   a first channel region is formed beneath the first gate insulting film so as not to be offset relative to the first impurity diffusion region while a second channel region is formed beneath the second gate insulating film so as to be offset relative to the second impurity diffusion region.

2. The semiconductor device of claim 1,
   wherein the second impurity diffusion region is offset relative to the second channel region in a transverse direction in a region below the second sidewall insulating film.

3. The semiconductor device of claim 2,
   wherein the second impurity diffusion region is offset relative to the second channel region by the width at the lower part of the second sidewall insulating film.

4. The semiconductor device of claim 1,
   wherein the first impurity diffusion region and the second impurity diffusion region serve as source/drain diffusion regions, and
   an extension diffusion region is formed below the first sidewall insulating film in the semiconductor substrate while no extension diffusion region is formed below the second sidewall insulating film in the semiconductor substrate.

5. The semiconductor device of claim 4,
   wherein the upper level of a region of the semiconductor substrate where it is located below the first sidewall insulating film is equal to the upper level of the first channel region, and
   the upper level of a region of the semiconductor substrate where it is located below the second sidewall insulating film is lower than the upper level of the second channel region.

6. The semiconductor device of claim 5,
   wherein the second impurity diffusion region is offset relative to the second channel region by a distance obtained by adding together the width at the lower part of the second sidewall insulating film and a difference between the upper level of a part of the semiconductor substrate where it is located on each side of the second gate electrode and the lower level of the second gate insulating film.

7. The semiconductor device of claim 1,
   wherein the first impurity diffusion region and the second impurity diffusion region serve as extension diffusion regions, the upper level of the first impurity diffusion region is equal to the upper level of the first channel region, and the upper level of the second impurity diffusion region is lower than the upper level of the second channel region.

8. The semiconductor device of claim 1, wherein the second impurity diffusion region is offset relative to the second channel region in a vertical direction in a region below the second gate electrode.

9. The semiconductor device of claim 8, wherein the second impurity diffusion region is offset relative to the second channel region by a difference between the upper level of a part of the semiconductor substrate which is located on each side of the second gate electrode and the lower level of the second gate insulating film.

10. The semiconductor device of claim 1, wherein the second impurity diffusion region is higher in concentration than the first impurity diffusion region.

11. A semiconductor device, comprising:

a first MIS transistor which is driven at a relatively low source voltage; and a second MIS transistor which is driven at a relatively high source voltage, the first MIS transistor and the second MIS transistor being formed on the same semiconductor substrate, wherein the first MIS transistor includes:

a first gate insulating film formed on the semiconductor substrate;

a first gate electrode formed on the first gate insulating film;

a first sidewall insulating film formed at each side face of the first gate electrode; and a first impurity diffusion region formed in a region of the semiconductor substrate which is located on each side of the first gate electrode, the second MIS transistor includes:

a second gate insulating film formed on the semiconductor substrate;

a second gate electrode formed on the second gate insulating film;

a second sidewall insulating film formed at each side face of the second gate electrode; and a second impurity diffusion region formed in a region of the semiconductor substrate which is located on each side of the second gate electrode, a parasitic resistance of the first impurity diffusion region is 0.5 k$\Omega$ or lower, and a parasitic resistance of the second impurity diffusion region is 2 k$\Omega$ or higher.

* * * * *